United States Patent [19]

Jaeschke et al.

[11] 4,429,339
[45] Jan. 31, 1984

[54] AC TRANSISTOR SWITCH WITH OVERCURRENT PROTECTION

[75] Inventors: James R. Jaeschke, Waukesha; Walter L. Rutchik, Wauwatosa, both of Wis.

[73] Assignee: Eaton Corporation, Cleveland, Ohio

[21] Appl. No.: 390,722

[22] Filed: Jun. 21, 1982

[51] Int. Cl.³ .............................................. H02H 3/08
[52] U.S. Cl. ................................. 361/93; 330/207 P; 361/86; 361/91; 361/94
[58] Field of Search ...................... 361/56, 86, 87, 88, 361/91, 93, 94, 98, 100; 330/207 P

[56] References Cited

U.S. PATENT DOCUMENTS

| | | | |
|---|---|---|---|
| 4,042,889 | 8/1977 | Baker | 361/91 X |
| 4,158,866 | 6/1979 | Baker | 361/86 |
| 4,173,739 | 11/1979 | Yoshida | 330/207 P |
| 4,301,490 | 11/1981 | Nagel et al. | 330/207 P X |
| 4,375,074 | 2/1983 | Glogolja | 361/91 |

OTHER PUBLICATIONS

"Buffer Circuit for Line Driver Protects Against Shorts and ±325-V Surges" Electronic Design 11/8/77 pp. 102, 104.

Primary Examiner—Harry E. Moose, Jr.
Attorney, Agent, or Firm—C. H. Grace; M. E. Taken

[57] ABSTRACT

An AC transistor switch is provided with simple, accurate and fast overcurrent protection circuitry. A pair of transistors are connected in anti-series across an AC load line, and each transistor has an anti-parallel diode therearound conducting current in the alternate half cycles. Comparator means senses current flow through the diodes and is responsive to given threshold overload current to turn off the transistors. Voltage sensing means is referenced to a common point between the series connected transistors and senses the voltage at each main terminal relative to the common point to thus sense the voltage drop from the common point across each diode to its respective main terminal for sensing current flow through the respective diode. The current representative voltage is sensed through respective dedicated third and fourth diodes connected to the main terminals and having a common anode connection to the voltage sensing means such that the latter senses the more negative of the main terminals regardless of the relative potential therebetween.

27 Claims, 4 Drawing Figures

AC TRANSISTOR SWITCH WITH OVERCURRENT PROTECTION

TECHNICAL FIELD

The invention relates to transistor power switching circuitry for AC applications, and more particularly to overcurrent protection circuitry.

BACKGROUND AND SUMMARY

Various types of overcurrent protection circuitry are known for AC power transistor switching circuits. The higher the level of sensitivity desired, the higher the degree of sophistication required. A tradeoff is the switching speed, which decreases as the number of intermediate components increases. The present invention overcomes this tradeoff and affords both of the previously incompatable results of simplicity and fast speed in the protective circuitry.

The present invention uses the AC switching device itself for current level detection, affording both accuracy and quick direct detection. The invention eliminates auxiliary sensing devices such as shunts, current transformers and the like. Instead, the invention uses a portion of the switch already in the main AC current path for each direction current flow.

DETAILED DESCRIPTION

Figure 1:
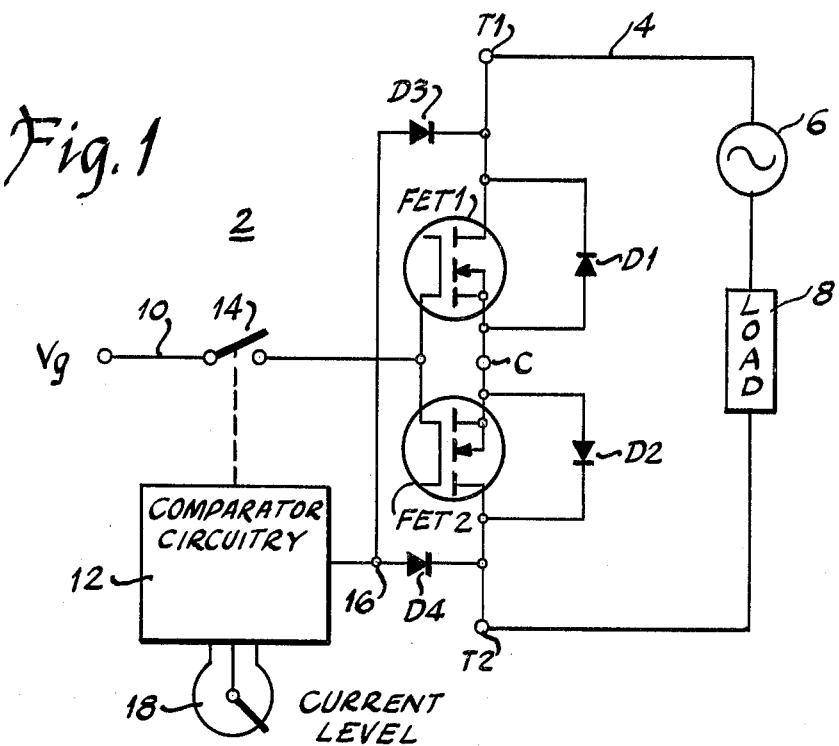
FIG. 1 is a schematic circuit diagram of an AC transistor switch with overcurrent protection constructed in accordance with the invention.

In FIG. 1, AC transistor switch 2 includes first and second transistors, such as n channel field effect transistors FET 1 and FET 2 connected source to source, in anti-series between first and second main terminals T1 and T2. The main terminals are connectable in an AC load circuit 4 having an AC power source 6 and a load 8 to be controlled by the FETs. First and second diodes D1 and D2 are each connected in reverse or anti-parallel relation with a respective FET. FETs have an inherent diode in the reverse direction, and in preferred form diodes D1 and D2 are these inherent diodes. This well known transistor-diode configuration provides a common reference point C, the source to source connection, allowing a common control signal for the opposing transistors.

Control terminal 10 supplies a drive signal from a voltage source $V_G$ to the gates of FET 1 and FET 2 to drive them into a conductive ON state. When terminal T1 is positive with respect to terminal T2, current flows in one direction from terminal T1 through FET 1 and diode D2 to terminal T2. In the reverse direction, with terminal T2 positive with respect to terminal T1, current flows from terminal T2 through FET 2 then through diode D1 to terminal T1.

Comparator means 12 senses current flow through diodes D1 and D2 and responds to given threshold overload current to turn off the FETs. Comparator 12 senses the one direction current flow through diode D2 and senses the reverse direction current flow through diode D1. Comparator 12 is connected to each main terminal T1 and T2 through respective third and fourth diodes D3 and D4 for sensing the current-induced voltage drop across diodes D1 and D2 and removing the drive signal when the sensed voltage exceeds a given threshold. The comparator is also connected to the control terminal 10 and includes switch means 14 for removing the drive signal. Switch 14 is actuated when the potential across either diode D1 or D2 exceeds a predetermined differential from a selectable reference voltage.

Diode D3 has its cathode connected in common with the cathode of diode D1 to main terminal T1. Diode D4 has its cathode in common with the cathode of diode D2 to main terminal T2. The anodes of diodes D3 and D4 are connected together at point 16 to comparator circuitry 12. Point 16 is thus referenced to the more negative of terminals T1 and T2, and comparator circuitry 12 senses the more negative of the main terminals. The voltage on each main terminal in each respective half cycle is sensed through the respective diode D3 or D4 to thus sense current flow through each inherent diode D1 and D2 by its voltage drop to its respective main terminal T1 or T2. The sensed current level is compared against a reference level 18 by comparator circuit 12, and a given threshold differential actuates switch 14 to remove the drive signal and turn off the FETs.

The current-induced voltage across diodes D1 and D2 is instantaneous with respect to the current. Normal delays associated with other means are thus avoided.

Figure 2:
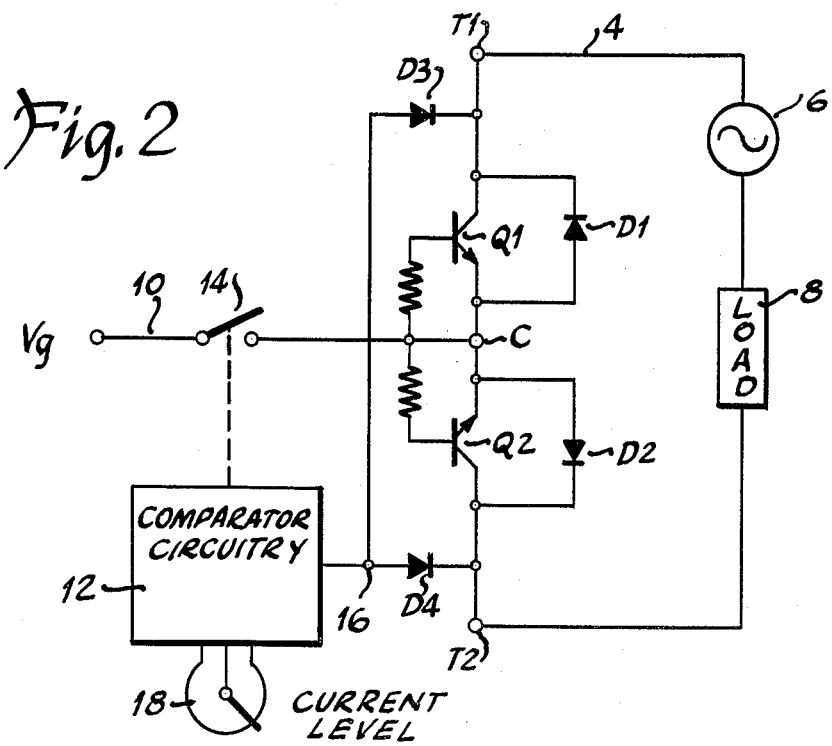
FIG. 2 is another embodiment of the circuit of FIG. 1.

FIG. 2 shows an alternate embodiment, and like reference numerals are used where appropriate to facilitate clarity. Bipolar transistors Q1 and Q2 are connected in anti-series with the AC load circuit. Q1 and Q2 are preferably NPN transistors connected emitter to emitter. Some Darlington transistors have inherent reverse diode characteristics, and these may be used for diodes D1 and D2. Otherwise, diodes D1 and D2 are added to the circuitry. The remainder of the protective circuitry is comparable to FIG. 1 and will now be described in greater detail.

Figure 3:
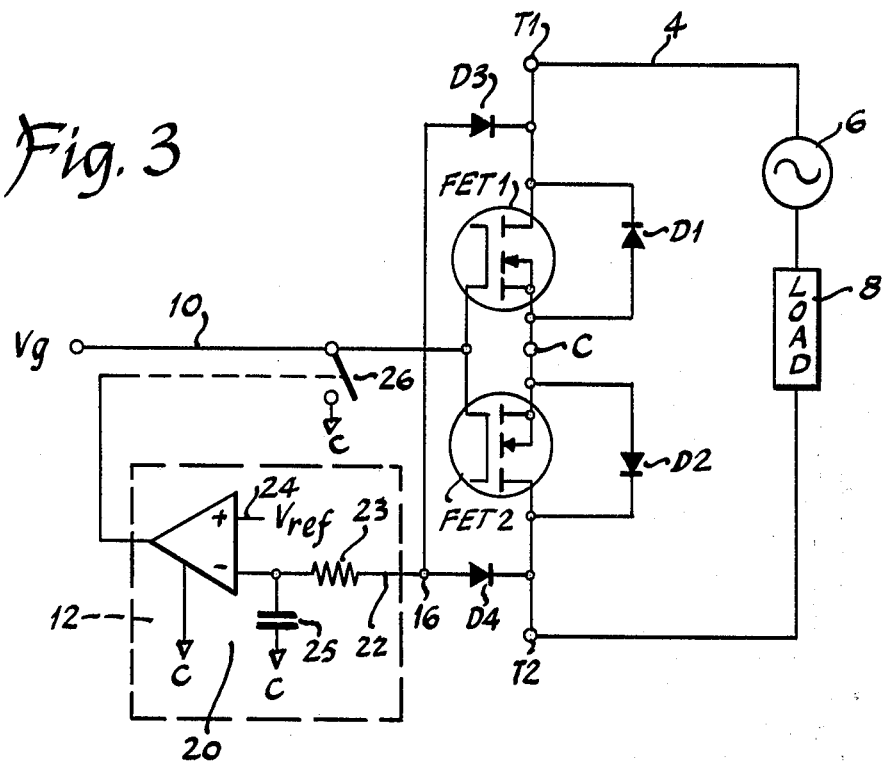
FIG. 3 illustrates in further detail the comparator circuitry of FIG. 1.

As noted above, current level through diodes D1 and D2 is sensed by the voltage drop thereacross to their respective main terminals T1 or T2. In preferred form, comparator circuitry 12 includes voltage sensing means 20, FIG. 3, sensing the voltage on each main terminal T1 and T2 through the respective diode D3 or D4. It is preferred that the voltage sensing means be referenced to a common point C between the series connected FETs such that the sensed voltage at each main terminal is referenced to common point C. The voltage sensing means thus senses the voltage drop from common point C across each diode D1 or D2 to its respective main terminal T1 or T2, for sensing current flow through each respective diode D1 or D2.

In one form voltage sensing means 20 is a differential amplifier having one input 22 connected to the common anode point 16 of diodes D3 and D4, and having another input 24 connected to a reference voltage $V_{ref}$ which may be tied or referenced to common point C. Amplifier 20 generates an output when the difference in voltage levels between inputs 22 and 24 exceeds a predetermined differential selectable according to $V_{ref}$ which corresponds to selectable current level 18 of FIG. 1. A selectable time delay may be provided by RC means such as resistor 23 and capacitor 25. Amplifier 20 is likewise referenced to common point C. The output of amplifier 20 actuates switch means 14 of FIG. 1 as described previously or alternatively actuates switch means 26 in FIG. 3 to close the latter and remove the drive signal from the transistors by diverting the drive signal through switch 26 to common point C, whereby to turn off the transistors. Various types of fast turn-off circuitry as known in the art, for example applying a negative bias, may alternatively or additionally be incorporated for switches 14 or 26.

Figure 4:
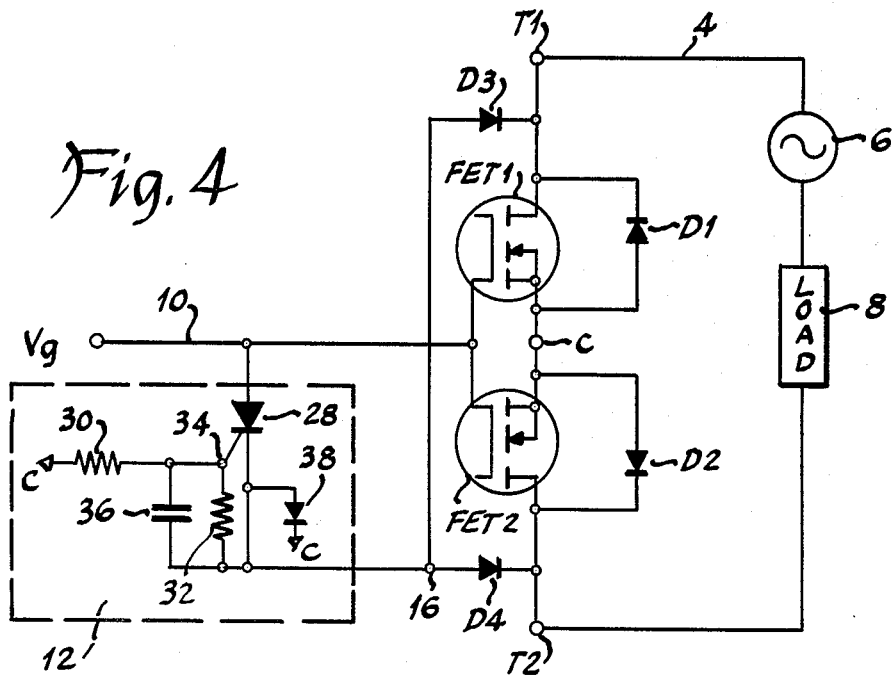
FIG. 4 illustrates in further detail alternative comparator circuitry of FIG. 1.

FIG. 4 shows alternate voltage sensing means within comparator circuitry 12. An SCR 28 (silicon controlled rectifier) has its cathode connected to common anode point 16 of diodes D3 and D4, and its anode connected to control terminal 10. Voltage division circuitry comprising resistors 30 and 32 is connected and referenced to common point C and to the SCR cathode, and supplies trigger voltage to the gate of SCR 28. If the voltage at either main terminal T1 or T2 and thus at point 16 drops below a given level relative to point C, then the divided voltage at point 34 at the gate of SCR 28 is sufficient to trigger the SCR into conduction. When SCR 28 turns ON, it diverts gate drive from gate terminal 10 away from the FET gates and instead through SCR 28 to point 16 and the more negative of the main terminals, to thus turn off the FETs. Diode 38 is connected between the SCR cathode and common point C so that as the FETs turn off the conduction path for SCR 28 is maintained through diode 38. Thus the protective turn-off remains until the drive signal is removed, allowing the SCR to reset. Capacitor 36 may be provided to afford a programmed level-dependent delay in the triggering signal.

It is recognized that various modifications are possible within the scope of the appended claims.

We claim:

1. An AC transistor switch with overcurrent protection comprising:
    first and second transistors connected in anti-series between first and second main terminals;
    first and second diodes, each connected in anti-parallel around a respective one of said first and second transistors; and
    comparator means for sensing current flow through said diodes and responsive to given threshold overload current to turn off said transistors.

2. The invention according to claim 1 wherein said main terminals are connectable in series with an AC load circuit and comprising control terminal means for supplying a drive signal to said transistors to turn them ON such that current flows in one direction between said main terminals through said first transistor and said second diode, and current flows in the reverse direction between said main terminals through said second transistor and said first diode, said comparator means sensing said one direction flow through said second diode, and sensing said reverse direction current flow through said first diode, and responsive to given threshold overload current to remove said drive signal.

3. The invention according to claim 2 wherein said comparator means is connected to each said main terminal and to said control terminal means, and includes switch means for removing said drive signal and actuated by the current-induced potential across either said diode exceeding a predetermined differential from a selectable reference potential.

4. The invention according to claim 3 comprising third and fourth diodes each connected to a respective one of said main terminals in common with a respective one of said first and second diodes, and comprising means sensing the voltage across each said first and second diode through its respective said third or fourth diode to thus sense the current flow through each said first and second diode.

5. The invention according to claim 4 wherein said voltage sensing means is referenced to a common point between said series connected transistors such that the sensed voltage at each said main terminal is referenced to said common point whereby to sense the voltage drop from said common point across each said first and second diode to its respective said main terminal for sensing current flow through each respective said first and second diode.

6. The invention according to claim 5 wherein:
    the cathode of said third diode and of said first diode are connected in common to the first of said main terminals connected to said first transistor;
    the cathode of said fourth diode and of said second diode are connected in common to the second of said main terminals connected to said second transistor; and
    the anodes of said third and fourth diodes are connected in common to said voltage sensing means, such that the latter senses the more negative of said main terminals with respect to said common point between said transistors.

7. The invention according to claim 6 wherein each said transistor is a FET (field effect transistor) and each said first and second diode is the inherent diode of the respective said FET.

8. The invention according to claim 7 wherein said FETs are connected source to source and driven by a single control terminal supplying the same drive signal to each FET.

9. The invention according to claim 6 wherein each said transistor is a bipolar transistor.

10. The invention according to claim 9 wherein said bipolar transistors are connected emitter to emitter, and driven by a single control terminal supplying the same drive signal to each.

11. The invention according to claim 6 wherein said voltage sensing means comprises amplifier means having one input connected to said common anodes of said third and fourth diodes, and another input connected to said reference voltage, and generating an output when the difference between the voltages on said inputs exceeds said predetermined differential, said output acutating said switch means.

12. The invention according to claim 6 wherein said comparator means comprises an SCR (silicon controlled rectifier) having an anode connected to said control terminal means and having a cathode connected to said common anodes of said third and fourth diodes, and including voltage division circuitry referenced to said common point between said series connected transistors and to said SCR cathode and supplying trigger voltage to the gate of said SCR such that if the voltage at either said main terminal drops below a given level relative to said last mentioned common point, the divided voltage at the gate of said SCR rises to a sufficient level to trigger the latter into conduction and divert said drive signal from said control terminal means to the more negative said main terminal.

13. The invention according to claim 12 further comprising a diode having an anode connected to said SCR cathode and having a cathode connected to said last mentioned common point so that as said transistors turn off the conduction path for said SCR is maintained through said last mentioned diode.

14. An AC transistor switch with overcurrent protection comprising:
   a pair of FETs (field effect transistors) connected in anti-series between a pair of main terminals, said FETs having an ON state responsive to gate drive to enable conduction between said main terminals, said FETs having an OFF state in the absence of said gate drive to block current flow between said main terminals, each said FET having an inherent diode in anti-parallel therewith; and
   comparator means for sensing current flow through said inherent diodes and responsive to given threshold overload current to remove gate drive and turn off said FETs.

15. The invention according to claim 14 wherein:
   current flows in a first direction from one said main terminal through one said FET then through the other said inherent diode of the other said FET to the other said main terminal;
   current flows in the reverse direction from said other main terminal through said other FET then through the one said inherent diode of said one FET to said one main terminal;
   said comparator means senses current flow through said other inherent diode for said first direction current flow between said main terminals; and
   said comparator means senses current flow through said one inherent diode for said reverse direction current flow between said main terminals.

16. The invention according to claim 15 wherein said comparator means is connected to each said inherent diode for sensing the voltage thereat for a respective said current flow direction and removing said gate drive when said sensed voltage exceeds a given threshold.

17. The invention according to claim 16 wherein said comparator means comprises third and fourth diodes each connected to a respective one of said inherent diodes for sensing a potential thereat relative to a reference voltage, and responsive to a predetermined differential therebetween to remove said gate drive.

18. The invention according to claim 17 wherein said third and fourth diodes have their cathodes connected to respective said main terminals in common with the cathodes of respective said inherent diodes, the anodes of said third and fourth diodes being connected to voltage sensing means for comparison against said reference voltage.

19. The invention according to claim 18 wherein: said main terminals are connectable in series with an AC load circuit;
   when said one main terminal is negative with respect to the other said main terminal, said comparator means senses current flow through said one inherent diode by sensing the potential of said one main terminal through said third diode;
   when said other main terminal is negative with respect to said one main terminal, said comparator means senses current flow through said other inherent diode by sensing the potential of said other main terminal through said fourth diode.

20. An AC transistor switch with overcurrent protection comprising:
   first and second FETs (field effect transistors) connected in anti-series between first and second main terminals which are connectable in series with an AC load circuit, said FETs having respective first and second inherent diodes in anti-parallel therewith;
   gate terminal means for supplying gate drive to said FETs to turn them ON such that current flows in one direction through said first FET and said second inherent diode between said main terminals, and current flows in the reverse direction through said second FET and said first inherent diode between said main terminals; and
   comparator means sensing said one direction current flow through said second inherent diode and sensing said reverse direction current flow through said first inherent diode, and responsive to given threshold overload current to remove said gate drive.

21. The invention according to claim 20 wherein said comparator means is connected to each said main terminal and to said gate terminal means, and includes switch means for removing said gate drive and actuated by the potential across either said inherent diode exceeding a predetermined differential from a selectable reference voltage.

22. The invention according to claim 21 wherein said comparator means comprises third and fourth diodes each connected to a respective one of said main terminals in common with a respective one of said inherent diodes, and comprising means sensing the voltage on each said main terminal through its respective said third or fourth diode to thus sense the current flow through each said inherent diode by its voltage drop to its respective said main terminal.

23. The invention according to claim 22 wherein:
   the cathode of said third diode and of said first inherent diode are connected in common to said first main terminal;
   the cathode of said fourth diode and of said second inherent diode are connected in common to said second main terminal; and
   the anodes of said third and fourth diodes are connected in common to said voltage sensing means, such that the latter senses the more negative of said inherent diode voltage.

24. The invention according to claim 23 wherein:
   said voltage sensing means is referenced to a common point between said series connected FETs such that the sensed voltage at each said main terminal is referenced to said common point whereby to sense the voltage drop from said common point across each said inherent diode to its respective said main terminal for sensing current flow through each respective said inherent diode.

25. The invention according to claim 24 wherein said voltage sensing means comprises amplifier means having one input connected to said common anodes of said third and fourth diodes, and another input connected to said reference voltage, and generating an output when the difference between the voltages on said inputs exceeds said predetermined differential, said output actuating said switch means.

26. The invention according to claim 24 wherein said comparator means comprises an SCR (silicon controlled rectifier) having an anode connected to said control terminal means and having a cathode connected to said common anodes of said third and fourth diodes, and including voltage division circuitry referenced to said common point between said series FETs and to said SCR cathode and supplying trigger voltage to the gate of said SCR such that if the voltage at either said main terminal drops below a given level relative to said common point, the divided voltage at the gate of said SCR rises to a sufficient level to trigger the latter into conduction and divert said drive signal from said control terminal means to the more negative said main terminal.

27. The invention according to claim 26 further comprising a diode having its anode connected to said SCR cathode and having its cathode connected to said last mentioned common point so that as said FETs turn OFF the conduction path for said SCR is maintained through said last mentioned diode.

* * * * *